US011686987B2

(12) United States Patent
Yen et al.

(10) Patent No.: US 11,686,987 B2
(45) Date of Patent: *Jun. 27, 2023

(54) DISPLAY DEVICE

(71) Applicant: InnoLux Corporation, Miao-Li County (TW)

(72) Inventors: Chung-Wen Yen, Miao-Li County (TW); Yu-Tsung Liu, Miao-Li County (TW); Chao-Hsiang Wang, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/524,944

(22) Filed: Nov. 12, 2021

(65) Prior Publication Data

US 2022/0075219 A1 Mar. 10, 2022

Related U.S. Application Data

(63) Continuation of application No. 17/249,696, filed on Mar. 10, 2021, now Pat. No. 11,199,752, which is a
(Continued)

(30) Foreign Application Priority Data

Aug. 28, 2015 (TW) .................................. 104128305

(51) Int. Cl.
*G02F 1/1368* (2006.01)
*H01L 27/12* (2006.01)
(Continued)

(52) U.S. Cl.
CPC ...... *G02F 1/1368* (2013.01); *G02F 1/136286* (2013.01); *H01L 27/124* (2013.01);
(Continued)

(58) Field of Classification Search
CPC ............. G02F 1/1368; G02F 1/136286; G02F 1/13606; G02F 1/133345; H01L 27/1222; H01L 27/124
(Continued)

(56) References Cited

U.S. PATENT DOCUMENTS 9,366,931 B2   6/2016  Kaise
9,726,954 B2   8/2017  Amano
(Continued)

FOREIGN PATENT DOCUMENTS

JP    H05-275698 A    10/1993
JP    2006-317840 A   11/2006
(Continued)

OTHER PUBLICATIONS

Japanese language office action dated Aug. 4, 2020, issued in application No. JP 2016-075212.
(Continued)

*Primary Examiner* — Edward J Glick
*Assistant Examiner* — William D Peterson
(74) *Attorney, Agent, or Firm* — McClure, Qualey & Rodack, LLP

(57) ABSTRACT

The display device includes a first substrate; an active layer disposed on the first substrate; a first insulation layer disposed on the active layer; a first electrode layer disposed on the first insulation layer including a gate electrode line extending along a first direction and a protruding portion extending along a second direction; a second insulation layer disposed on the first electrode layer; and a second electrode layer disposed on the second insulation layer. The second electrode layer includes a date line extending along the second direction and a conductive layer. The conductive layer includes a first conductive portion and a second conductive portion, wherein the first conductive portion has
(Continued)

a first maximum width A along the first direction, and the second conductive portion has a second maximum width B along the first direction. The first maximum width A is less than the second maximum width B.

8 Claims, 12 Drawing Sheets

Related U.S. Application Data continuation of application No. 16/861,394, filed on Apr. 29, 2020, now Pat. No. 10,976,630, which is a continuation of application No. 15/246,252, filed on Aug. 24, 2016, now Pat. No. 10,670,935.

(51) Int. Cl.
  *G02F 1/1362* (2006.01)
  *G02F 1/1333* (2006.01)
  *G02F 1/136* (2006.01)

(52) U.S. Cl.
  CPC ...... *H01L 27/1222* (2013.01); *G02F 1/13606* (2021.01); *G02F 1/133345* (2013.01)

(58) Field of Classification Search
  USPC .......................................................... 349/46
  See application file for complete search history.

(56) References Cited

U.S. PATENT DOCUMENTS

| | | | |
|---|---|---|---|
| 11,199,752 B2* | 12/2021 | Yen | ................... G02F 1/136286 |
| 2008/0024416 A1* | 1/2008 | Onogi | ................... G02F 1/1368 |
| | | | 345/87 |
| 2016/0005769 A1* | 1/2016 | Uramoto | ............. G02F 1/13439 |
| | | | 257/72 |

FOREIGN PATENT DOCUMENTS

| | | |
|---|---|---|
| JP | 2007-199708 A | 8/2007 |
| JP | 2010-230888 A | 10/2010 |
| WO | 2012/144517 A1 | 10/2012 |
| WO | 2014/002834 A1 | 1/2014 |

OTHER PUBLICATIONS

Japanese language office action dated May 11, 2021, issued in application No. JP 2020-069124.

* cited by examiner

DISPLAY DEVICE

CROSS REFERENCE TO RELATED APPLICATION

This Application is a Continuation of U.S. application Ser. No. 17/249,696, filed on Mar. 10, 2021 (now U.S. Pat. No. 11,199,752), which is a Continuation of U.S. application Ser. No. 16/861,394, filed on Apr. 29, 2020 (now U.S. Pat. No. 10,976,630), which is a Continuation of U.S. application Ser. No. 15/246,252, filed on Aug. 24, 2016 (now U.S. Pat. No. 10,670,935), which is based on, and claims priority from, Taiwan Application Serial Number 104128305, filed on Aug. 28, 2015, the disclosure of which is hereby incorporated by reference herein in its entirety.

TECHNICAL FIELD

The disclosure relates to a display device.

BACKGROUND

Liquid-crystal display (LCD) devices, characterized by their low radiation, small size, and low power consumption, have gradually replaced traditional cathode ray tube (CRT) displays and become widely used in various electronic products, such as notebook computers, personal digital assistants (PDAs), flat panel TVs, and mobile phones.

In traditional LCD devices, external source drivers and gate drivers are used for driving the pixels of a panel in order to display images. Recently, a gate driver on array (GOA) technique has been developed in which the gate driver is fabricated directly on the LCD panel.

However, since there is parasitic capacitance between the gate electrode and the drain electrode of the traditional thin film transistor, the pixel element is apt to be affected by the parasitic capacitance during operation, resulting in a feed-through effect. This feed-through effect can easily cause the image to flicker, thus reducing the quality of the display.

SUMMARY

According to the embodiments of the disclosure, the disclosure provides a display device including a first substrate; a second substrate; a display media layer disposed between the first substrate and the second substrate; an active layer disposed on the first substrate; a first insulation layer disposed on the active layer; a first electrode layer disposed on the first insulation layer, wherein the first electrode layer includes a gate line extending along a first direction and a protruding portion extending along a second direction, and wherein the first direction is orthogonal to the second direction; a second insulation layer disposed on the first electrode layer; and, a second electrode layer disposed on the second insulation layer, wherein the second electrode layer includes a data line extending along the second direction and a conductive pattern, wherein the data line and the conductive pattern are disposed at the two opposite sides of the protruding portion, and the date line and the conductive pattern are in electrical contact with the active layer through the first contact via and the second contact via respectively. In addition, the conductive pattern includes a first conductive portion and a second conductive portion, wherein the first conductive portion is disposed between the second conductive portion and the gate electrode line. An interface between the first conductive portion and the second conductive portion extends along the first direction, and a projection of the first conductive portion onto the substrate at least partially overlaps a projection of the protruding portion onto the substrate in the second direction. In particular, the first conductive portion has a first maximum width A along the first direction, and the second conductive portion has a second maximum width B along the first direction, and wherein the first maximum width A is less than the second maximum width B According to other embodiments of the disclosure, the display device of the disclosure can also include a first substrate; a second substrate; a display media layer disposed between the first substrate and the second substrate; an active layer disposed on the first substrate; a first insulation layer disposed on the active layer; a first electrode layer disposed on the first insulation layer, wherein the first electrode layer includes a gate electrode line extending along a first direction; a second insulation layer disposed on the first electrode layer; and, a second electrode layer disposed on the second insulation layer, wherein the second electrode layer includes a data line extending along a second direction and a conductive pattern, wherein the first direction is orthogonal to the second direction. The date line and the conductive pattern are in electrical contact with the active layer through the first contact via and the second contact via respectively. The gate electrode line includes a first gate electrode portion and a second gate electrode portion, wherein the first gate electrode portion overlaps the active layer, wherein there is a first minimum distance D2 between a projection of the first gate electrode portion onto the first substrate and a projection of the conductive pattern onto the first substrate, and there is a second minimum distance D3 between a projection of the second gate electrode portion onto the first substrate and a projection of the conductive pattern onto the first substrate, wherein the first minimum distance D2 is greater than the second minimum distance D3.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
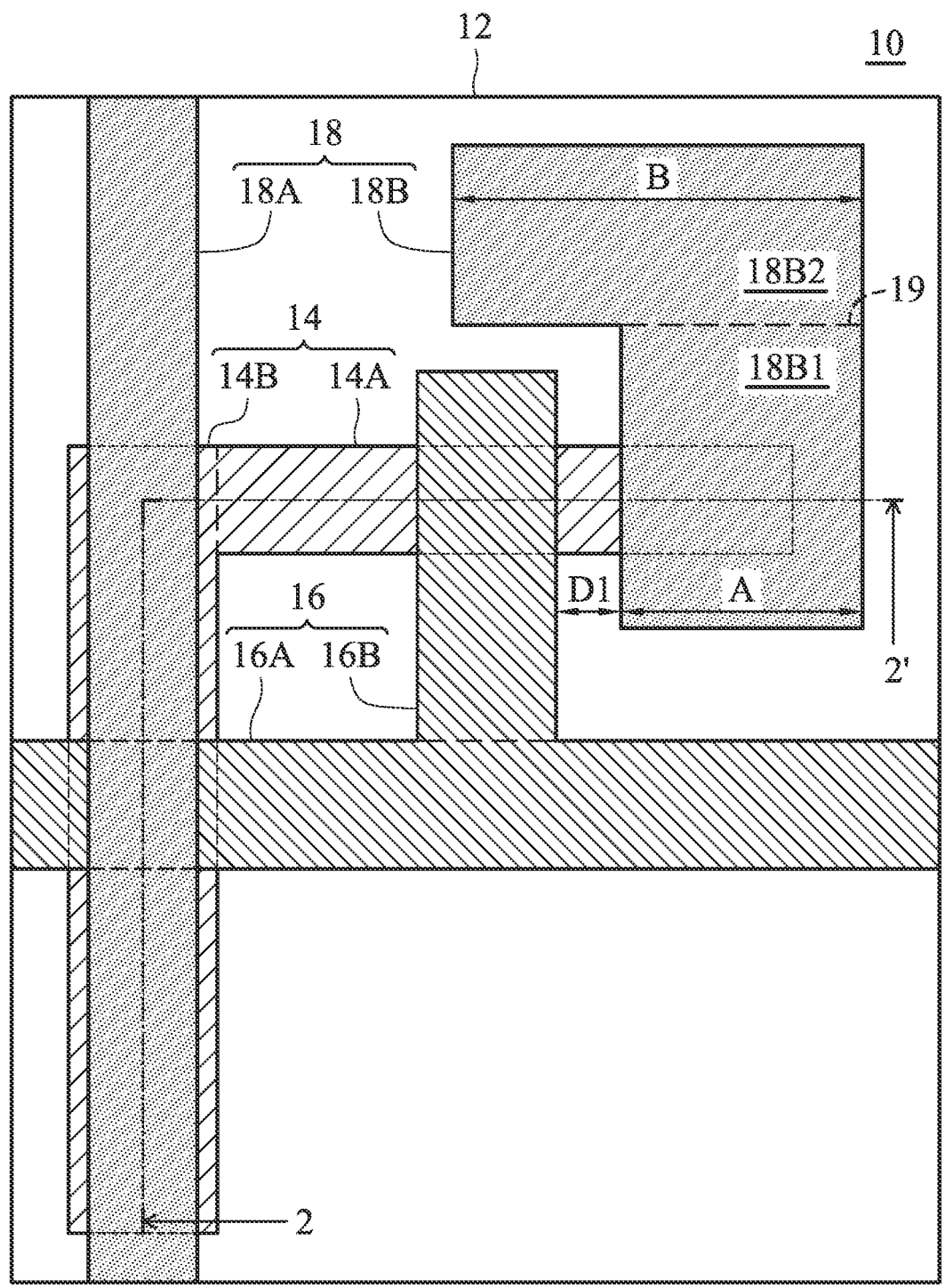
FIG. 1 is a schematic top view of the display device according to an embodiment of the disclosure.

This description is made for the purpose of illustrating the general principles of the disclosure and should not be taken in a limiting sense. The scope of the disclosure is determined by reference to the appended claims.

The display device of the disclosure is described in detail in the following description. In the following detailed description, for purposes of explanation, numerous specific details and embodiments are set forth in order to provide a thorough understanding of the disclosure. The specific elements and configurations described in the following detailed description are set forth in order to clearly describe the disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that directly contacts the other layer, and they may also refer to a layer that does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

Moreover, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The display device according to the embodiments of the disclosure can have a low parasitic capacitance between a conductive pattern and a gate electrode line due to the specific shape and design of the conductive pattern, resulting in reducing the feed-through effect, avoiding image flickers observed on the display device, and improving the performance of the display device. The display device according to the embodiments of the disclosure can include a low temperature polysilicon thin film transistor (LTPS-TFT), wherein the active layer of the low temperature polysilicon thin film transistor serving as an active layer can be L-shaped or U-shaped.

FIG. 1 shows a schematic top view of the display device 10 according to an embodiment of the disclosure. The first substrate, the active layer, the first electrode layer, and the second electrode layer are illustrated in FIG. 1 in the absence of other elements (such as the second substrate, the display media layer (such as liquid-crystal layer) disposed between the first substrate and the second substrate, and the insulation layers), in order to clarify the relationship between the active layer, the first electrode layer, and the second electrode layer.

The display device 10 includes an active layer 14 disposed on the first substrate 12. The active layer 14 can include of a first active layer portion 14A and a second active layer portion 14B, wherein the first active layer portion 14A extends along a first direction X and the second active layer portion 14B extends along a second direction Y, wherein the first direction X is orthogonal to the second direction Y. The term "orthogonal to" refers to an angle between the first direction and the second direction within the range of 90±10 degrees. The first active layer portion 14A is in direct contact with the second active layer portion 14B. The active layer 14 can be L-shaped, as shown in FIG. 1. A first electrode layer 16 is disposed on a first insulation layer (not shown), wherein the first insulation layer can be disposed on the first substrate 12 to cover the active layer 14. Namely, the first electrode layer 16 is separated from the active layer 14 by the first insulation layer. The first electrode layer 16 can include a gate electrode line 16A extending along the first direction X and a protruding portion 16B extending alone a second direction Y. The gate electrode line 16A is in direct contact with the protruding portion 16B. The first electrode layer 16 can be T-shaped, as shown in FIG. 1. The protruding portion 16B of the first electrode layer 16 overlaps the first active layer portion 14A of the active layer 14. The gate electrode line 16A of the first electrode layer 16 overlaps the second active layer portion 14B of the active layer 14. A second insulation layer (not shown) can be disposed on the first insulation layer to cover the first electrode layer 16. A second electrode layer 18 is disposed on the second insulation layer.

As shown in FIG. 1, the second electrode layer 18 includes a data line 18A extending along the second direction Y and a conductive pattern 18B, wherein the data line 18A is in electrical contact with the conductive pattern 18B, but the data line 18A is not in direct contact with the conductive pattern 18B. The data line 18A and the conductive pattern 18B are disposed on the two opposite sides of the protruding portion 16B of the first electrode layer 16. Namely, a projection of the data line 18A onto the first substrate 12 is separated from a part of a projection of the conductive pattern 18B onto the first substrate 12 by a projection of the protruding portion 16B of the first electrode layer 16 onto the first substrate 12. Namely, a projection of the protruding portion 16B of the first electrode layer 16 onto the first substrate 12 is disposed between a projection of the data line 18A onto the first substrate 12 and a part of a projection of the conductive pattern 18B onto the first substrate 12. The data line 18A is in electrical contact with the active layer 14 via a contact via (not shown) passing through the first insulation layer and the second insulation layer (not shown), and the conductive pattern 18B is in electrical contact with the active layer 14 via another contact via (not shown) passing through the first insulation layer and the second insulation layer (not shown). The conductive pattern 18B includes a first conductive portion 18B1 and a second conductive portion 18B2. The first conductive portion 18B1 connects the second conductive portion 18B2. The first conductive portion 18B1 is disposed between the second conductive portion 18B2 and the gate electrode line 16A. Namely, the second conductive portion 18B2 is separated from the gate electrode line 16A by the first conductive portion 18B1. In detail, a projection of the first conductive portion 18B1 onto the first substrate 12 is disposed between a projection of the second conductive portion 18B2 onto the first substrate 12 and a projection of the gate electrode line 16A onto the first substrate 12. The first conductive portion 18B1 directly connects to the second conductive portion 18B2. There is an interface 19 between the first conductive portion 18B1 and the second conductive portion 18B2, and the interface 19 extends along the first direction X, as shown in FIG. 1.

In addition, a projection of the second conductive portion 18B2 onto the first substrate 12 at least partially overlaps a projection of the protruding portion 16B onto the first substrate 12 in the second direction Y. Herein, the first conductive portion 18B1 has a maximum width A in the first direction X, the second conductive portion 18B2 has a maximum width B in the first direction X, and the maximum width A is less than the maximum width B in order to reduce the parasitic capacitance between the conductive pattern 18B and the first electrode layer 16 (such as the protruding portion 16B). As a result, the feed-through effect of the display device can be reduced, resulting in avoiding image flickers observed on the display device.

According to some embodiments of the disclosure, the first maximum width A can be between about 2.0 μm and 14.0 μm, the second maximum width B can be between about 3.0 μm and 15.0 μm, and the ratio of the first maximum width A to the second maximum width B is between 0.50 and 0.90, preferably between 0.75 and 0.8. In addition, according to the embodiments of the disclosure, in order to reduce the feed-through effect of the display device, the minimum distance D1 between a projection of the first conductive portion 18B1 onto the first substrate 12 and a projection of the protruding portion 16B onto the first substrate 12 can be greater than 0. According to the embodiments of the disclosure, the minimum distance D1 can be between about 0.1 μm and 1.0 μm.

Figure 2A:
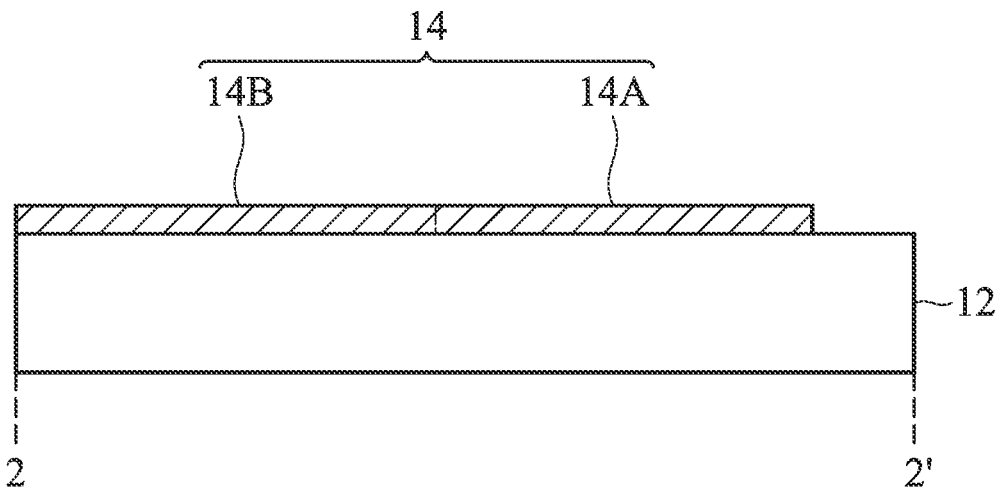
FIGS. 2A to 2F are schematic cross-sectional views illustrating the method for fabricating the display device as shown in FIG. 1 taken along the line 2-2'.

FIGS. 2A to 2F are schematic cross-sectional views illustrating the method for fabricating the display device 10 as shown in FIG. 1 taken along the line 2-2'. First, as shown in FIG. 2A, a first substrate 12 is provided, and an active layer 14 is formed on the first substrate 12. Suitable materials for the first substrate 12 can be quartz, glass, silicon, metal, plastic, or ceramic. The active layer 14 can be L-shaped. As shown in FIG. 1, the active layer 14 can include a first active layer portion 14A and a second active layer portion 14B, wherein the first active layer portion 14A extends along a first direction X, the second active layer portion 14B extends along a second direction Y, and the first active layer portion 14A is in contact with the second active layer portion 14B. The active layer 14 can be, but is not limited to, low temperature polysilicon (LTPS), indium gallium zinc oxide (IGZO), or another metal oxide semiconductor material.

Figure 2B:
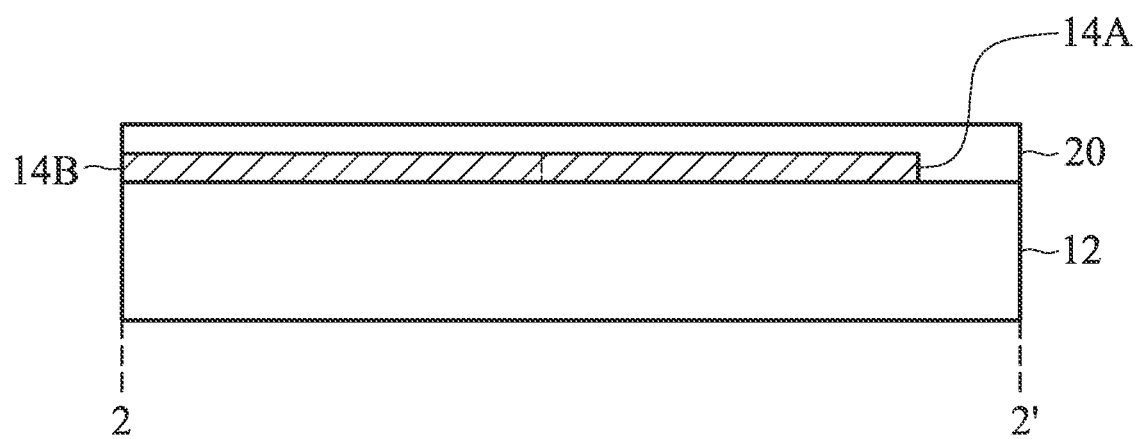
Figure 2C:
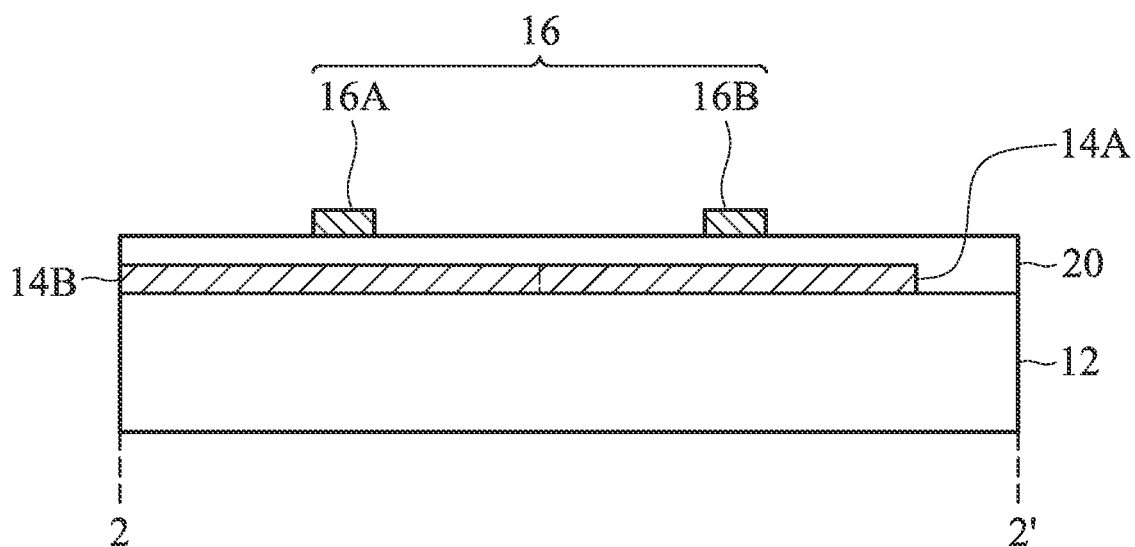

Next, as shown in FIG. 2B, a first insulation layer 20 is formed on the first substrate 12 to cover the active layer 14. Suitable materials for the first insulation layer 20 can be organic insulating material (such as photosensitive resin) or inorganic insulating material (such as silicon nitride, silicon oxide, silicon oxynitride, silicon carbide, alumina, or a combination thereof). Next, as shown in FIG. 2C, a first electrode layer 16 is formed on the first insulation layer 20, wherein the first electrode layer 16 can include a gate electrode line 16A extending along the first direction X and a protruding portion 16B extending along a second direction Y, and the gate electrode line 16A is in contact with the protruding portion 16B (As shown in FIG. 1). Suitable materials for the first electrode layer 16 can be aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof.

Figure 2D:
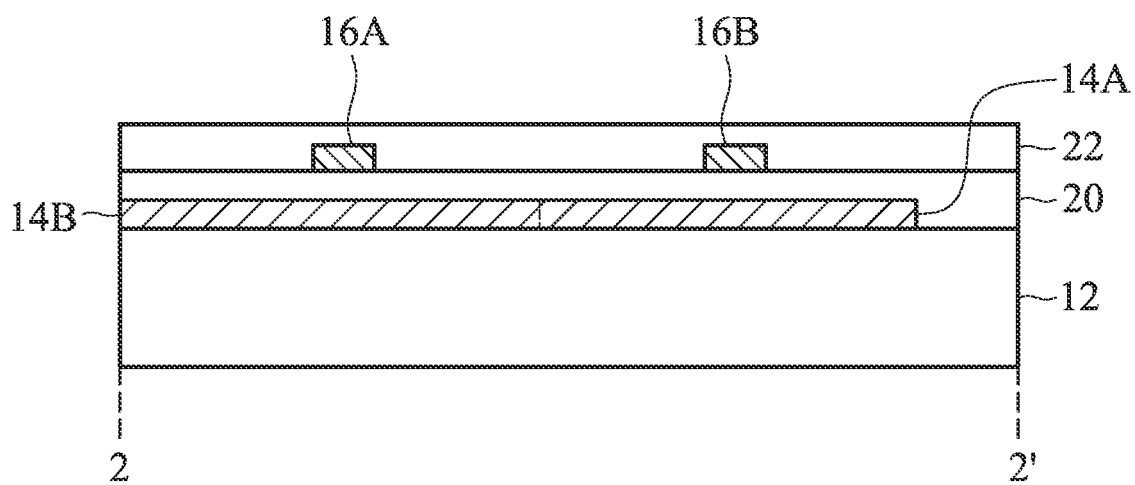
Figure 2E:
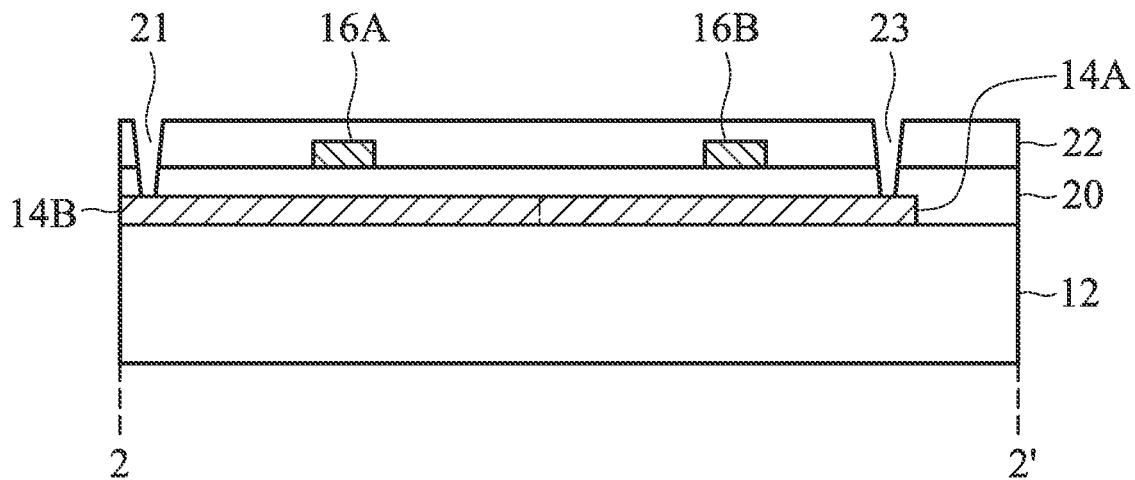

Next, as shown in FIG. 2D, a second insulation layer 22 is formed on the first insulation layer 20 to cover a part of the first electrode layer 16. The second insulation layer 22 can be organic insulating material (such as photosensitive resin) or inorganic insulating material (such as silicon nitride, silicon oxide, silicon oxynitride, silicon carbide, alumina, or a combination thereof), and the material of the second insulation layer 22 can be different from or the same as the first insulation layer 20. Next, as shown in FIG. 2E, a contact via 21 and a contact via 23a is formed to pass through the first insulation layer 20 and the second insulation layer 22, exposing the top surface of the second active layer portion 14B and the top surface of the first active layer portion 14A respectively.

Figure 2F:
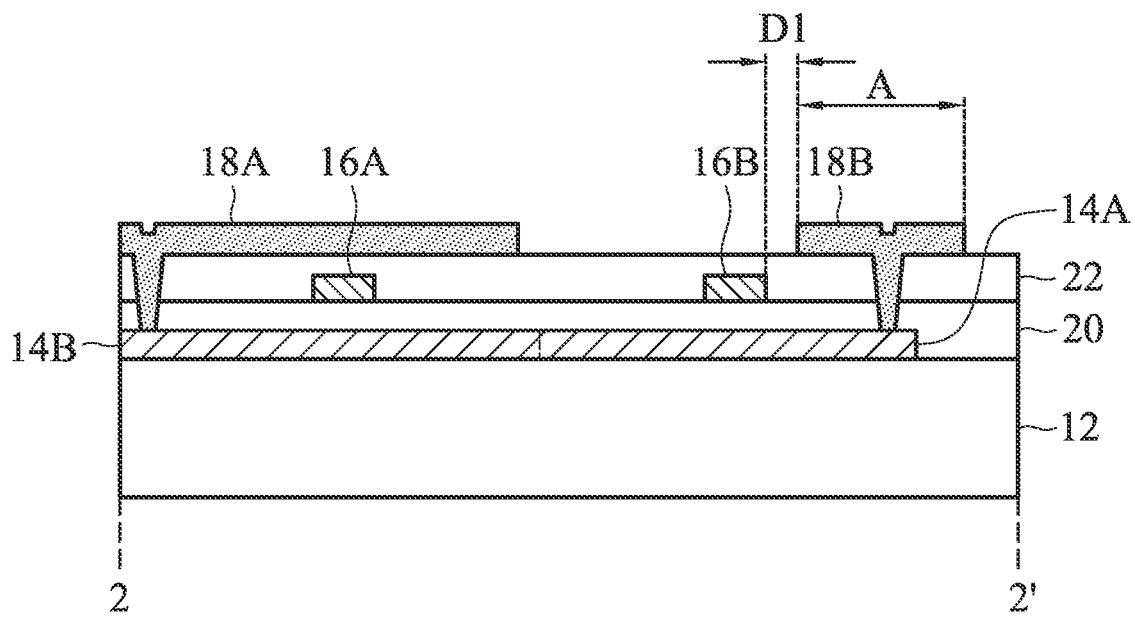

Finally, a second electrode layer 18 is formed on the second insulation layer 22, as shown in FIG. 2F and FIG. 1. The second electrode layer 18 includes a data line 18A extending along the second direction Y and a conductive pattern 18B, wherein the data line 18A is in electrical contact with the conductive pattern 18B, but the data line 18A is not in direct contact with the conductive pattern 18B. The data line 18A and the conductive pattern 18B are disposed on the two opposite sides of the protruding portion 16B of the first electrode layer 16. Namely, a projection of the protruding portion 16B onto the first substrate 12 is disposed between a projection of the data line 18A onto the first substrate 12 and a part of a projection of the conductive pattern 18B onto the first substrate 12. In addition, the data line 18A is in electrical contact with the second active layer portion 14B of the active layer 14 via a contact via 21 passing through the first insulation layer 20 and the second insulation layer 22, and the conductive pattern 18B is in electrical contact with the first active layer portion 14A of the active layer 14 via another contact via 23 passing through the first insulation layer 20 and the second insulation layer 22. According to some embodiments of the disclosure, the display device 10 may additionally include a light shielding layer (not shown) disposed on the first substrate 12 and under the active layer 14. The light shielding layer can be a black matrix, wherein the material of the black matrix can be organic insulating material (such as photosensitive layer) or metal-containing material. The active layer 14 can be separated from the light shielding layer by an insulation layer (not shown).

Figure 3:
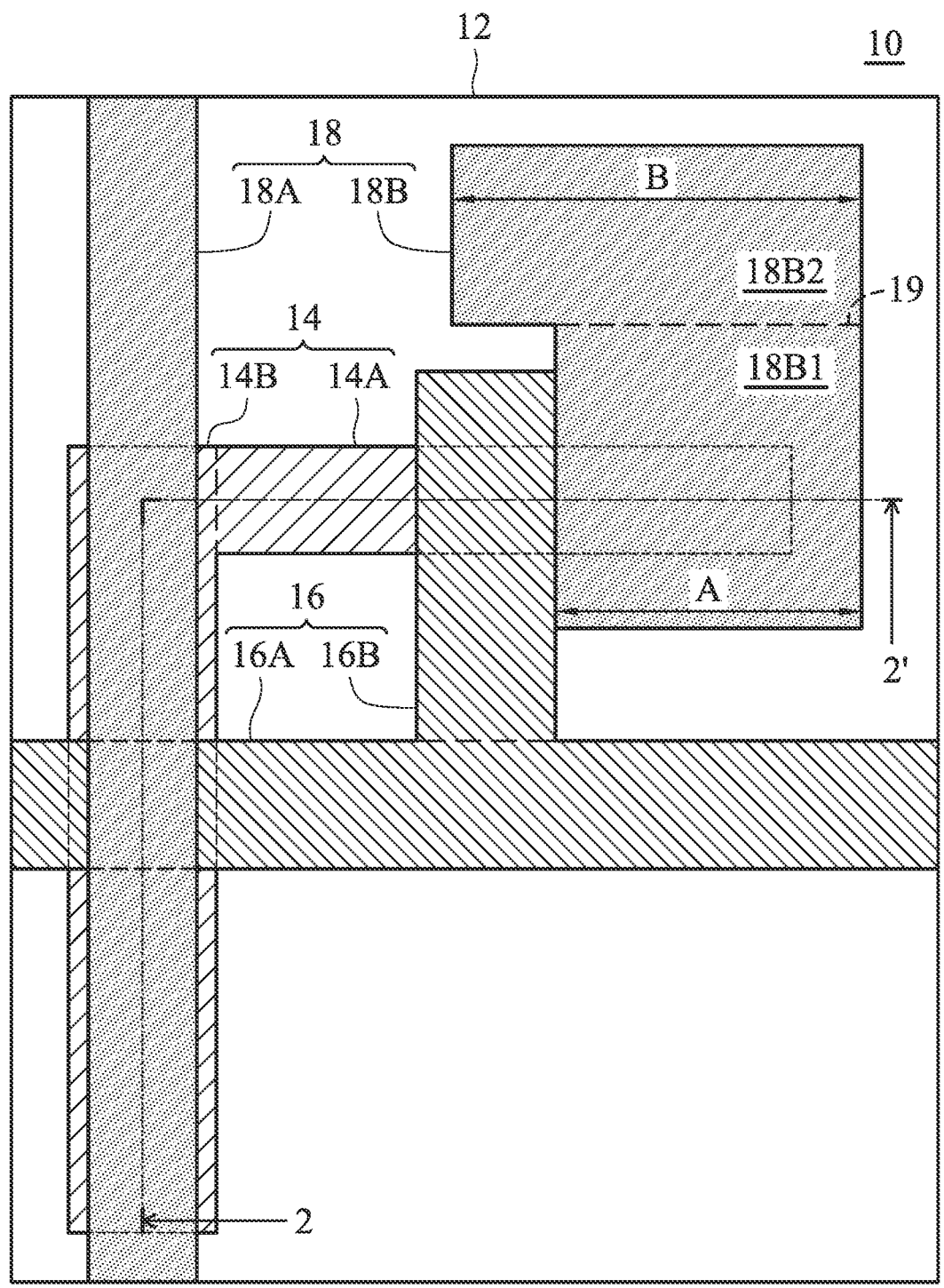
FIGS. 3-5 are schematic top views of the display device according to embodiments of the disclosure.
Figure 4:
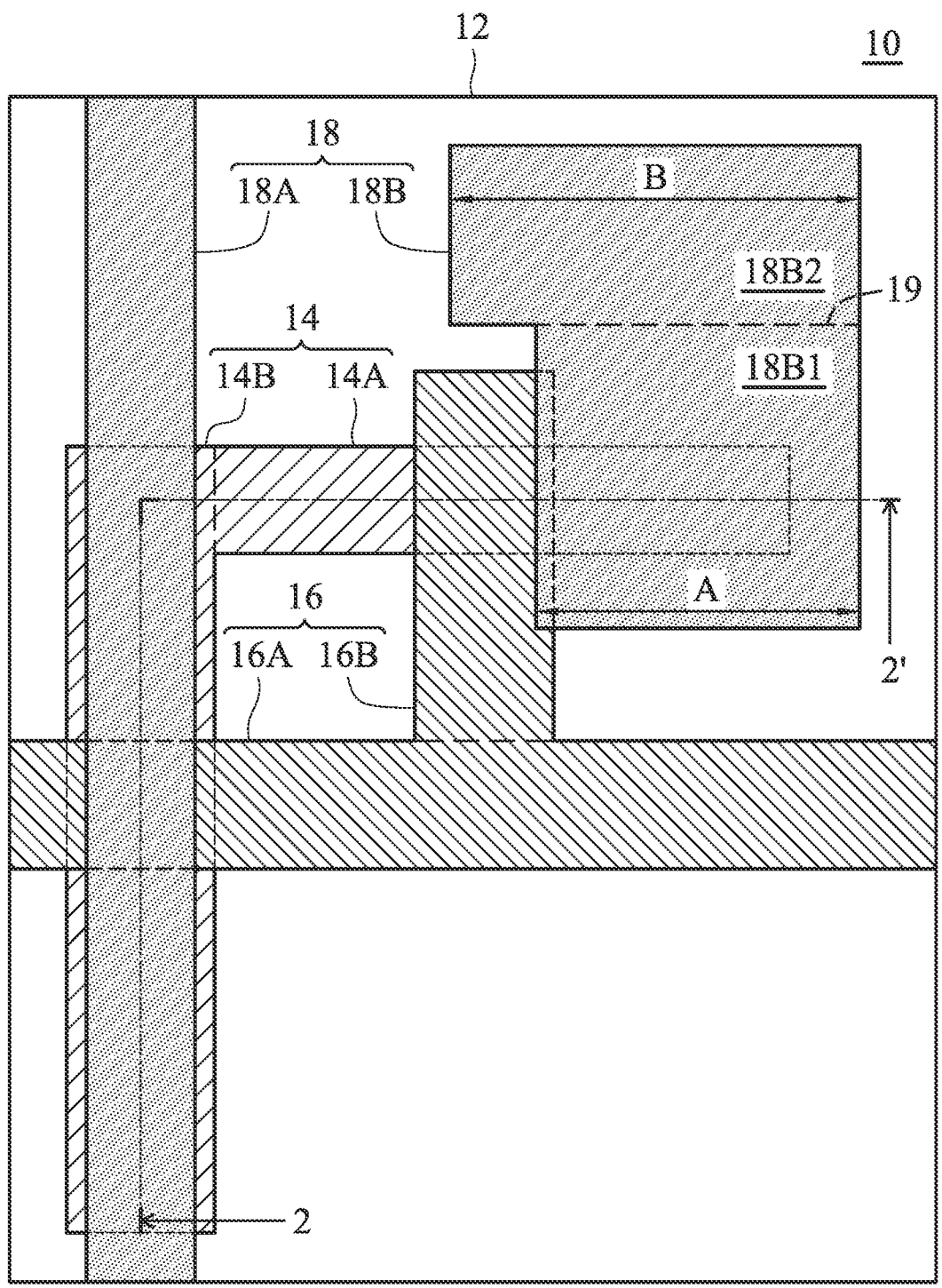

According to another embodiment of the disclosure, the minimum distance D1 between a projection of the first conductive portion 18B1 onto the first substrate 12 and a projection of the protruding portion 16B onto the first substrate 12 can be 0. Namely, a projection of the first conductive portion 18B1 onto the first substrate 12 is proximate to a projection of the protruding portion 16B onto the first substrate 12, as shown in FIG. 3. In addition, according to other embodiments of the disclosure, a projection of the first conductive portion 18B1 onto the first substrate 12 can overlap a part of a projection of the protruding portion 16B onto the first substrate 12. The width of the overlapped area in the first direction X can be between 0.1 μm and 0.5 μm, as shown in FIG. 4.

Figure 5:
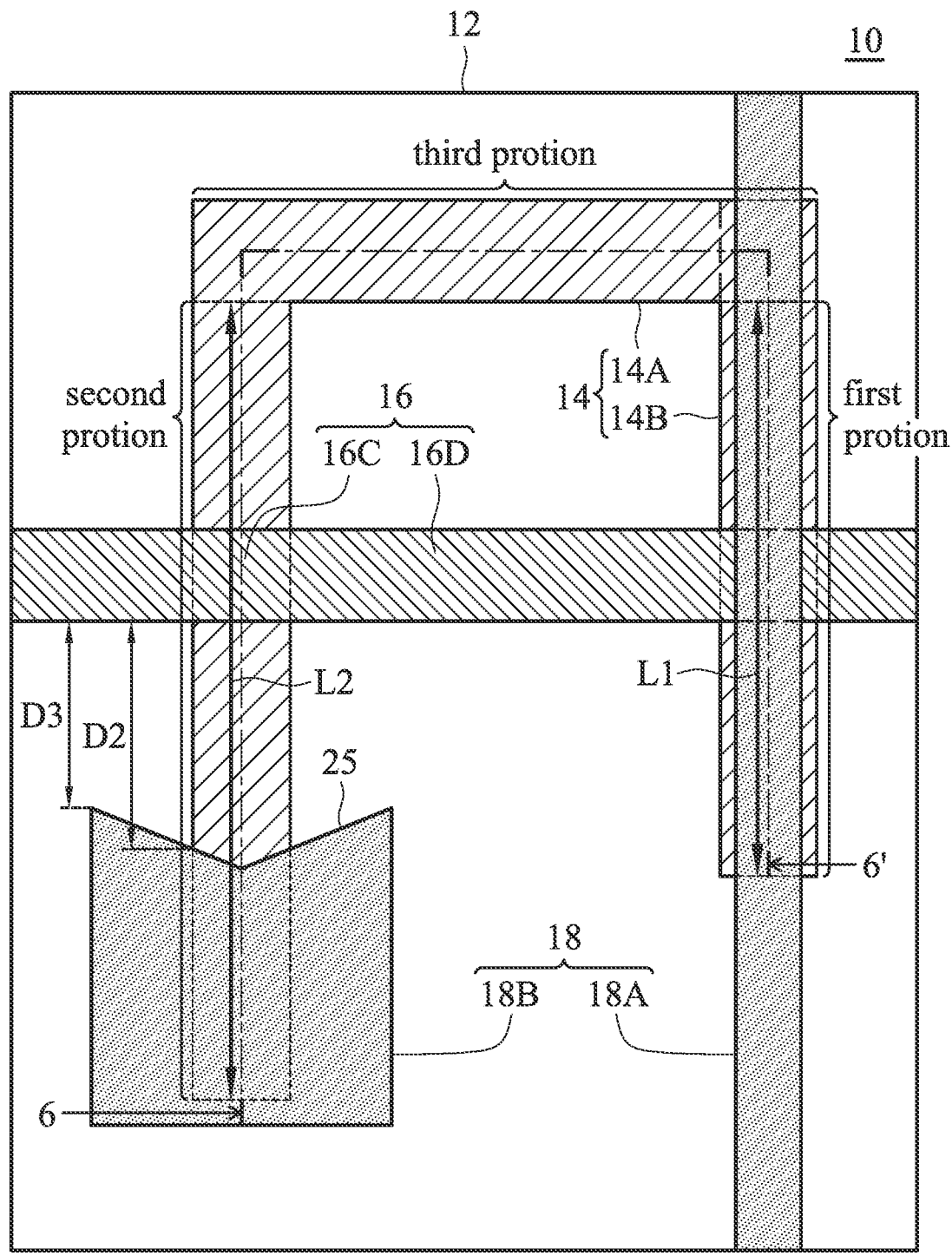

FIG. 5 shows a schematic top view of the display device 10 according to another embodiment of the disclosure. The first substrate, the active layer, the first electrode layer, and the second electrode layer are illustrated in FIG. 5 in the absence of other elements (such as the second substrate, the display media layer (such as liquid-crystal layer) disposed between the first substrate and the second substrate, and the insulation layers), in order to clarify the relationship between the active layer, the first electrode layer, and the second electrode layer. The display device 10 includes an active layer 14 disposed on the first substrate 12. The active layer 14 can include a first active layer portion 14A and a second active layer portion 14B. A projection of the first active layer portion 14A onto the first substrate 12 can be L-shaped. The first active layer portion 14A includes a first region extending along a first direction X and a second region extending along a second direction Y. The first active layer portion 14A is in contact with the second active layer portion 14B. The active layer 14 can be U-shaped, as shown in FIG. 5. A first electrode layer 16 is disposed on a first insulation layer (not shown), wherein the first insulation layer can be disposed on the first substrate 12 to cover the active layer 14. Namely, the first electrode layer 16 is separated from the active layer 14 by the first insulation layer. The first electrode layer 16 can be a gate electrode line extending along the first direction X. The first electrode layer 16 can include a first gate electrode portion 16C and a second gate electrode portion 16D. The first gate electrode portion 16C connects the second gate electrode portion 16D. The region of the first electrode layer 16, which overlaps the first active layer portion 14A, is defined as the first gate electrode portion 16C. Namely, a projection of the first active layer portion 14A onto the first substrate 12 overlaps the whole projection of the first gate electrode portion 16C onto the first substrate 12. In addition, the region of the first electrode layer 16, which does not overlap the first active layer portion 14A, is defined as the second gate electrode portion 16D. Namely, a projection of the first active layer portion 14A onto the first substrate 12 is proximate to a projection of the second gate electrode portion 16D onto the first substrate 12 (i.e. the projection of the first active layer portion 14A onto the first substrate 12 does not overlap a projection of the second gate electrode portion 16D onto the first substrate 12. A second insulation layer (not shown) can be disposed on the first insulation layer to cover the first electrode layer 16. A second electrode layer 18 is disposed on the second insulation layer.

As shown in FIG. 5, the second electrode layer 18 includes a data line 18A extending along the second direction Y and a conductive pattern 18B, wherein the data line 18A is in electrical contact with the conductive pattern 18B, but the data line 18A is not in direct contact with the conductive pattern 18B. The data line 18A is in electrical contact with the active layer 14 via a contact via (not shown) passing through the first insulation layer and the second insulation layer. The conductive pattern 18B is in electrical contact with the active layer 14 via another contact via (not shown) passing through the first insulation layer and the second insulation layer. According to the embodiments of the disclosure, the conductive pattern 18B has a non-linear side 25 (such as a depressed side). The non-linear side 25 of the conductive pattern 18B is adjacent to the first electrode layer 16. In addition, there is a minimum distance D2 between a projection of the first gate electrode portion 16C onto the first substrate 12 and a projection of the conductive pattern 18B onto the first substrate 12, and there is a minimum distance D3 between a projection of the second gate electrode portion 16D onto the first substrate 12 and a projection of the conductive pattern 18B onto the first substrate 12. The minimum distance D2 is greater than the minimum distance D3, in order to reduce the parasitic capacitance between the conductive pattern 18B and the first electrode layer 16. As a result, the feed-through effect of the display device can be reduced, resulting in avoiding image flickers observed on the display device. According to some embodiments of the disclosure, the minimum distance D2 can be between about 1.0 µm and 5.0 µm, the minimum distance D3 can be between about 0.5 µm and 4.5 µm, and the ratio of the minimum distance D3 to the minimum distance D2 (D3/D2) can be between about 0.50 and 0.95, preferably between about 0.80 and 0.90.

FIGS. 6A to 6F are schematic cross-sectional views illustrating the method for fabricating the display device 10 as shown in FIG. 5 taken along the line 6-6'. First, as shown in FIG. 2A, a first substrate 12 is provided, and an active layer 14 is formed on the first substrate 12. Suitable materials for the first substrate 12 can be quartz, glass, silicon, metal, plastic, or ceramic. The active layer 14 may be U-shaped. As shown in FIG. 5, the active layer 14 can includes a first active layer portion 14A and a second active layer portion 14B. The first active layer portion 14A includes a first region extending along a first direction X and a second region extending along a second direction Y. A projection of the first active layer portion 14A onto the first substrate 12 is L-shaped. The first region of the first active layer portion 14A is in contact with the second region of the first active layer portion 14A. The active layer 14 can be, but is not limited to, low temperature polysilicon (LTPS), indium gallium zinc oxide (IGZO), or another metal oxide semiconductor material.

Figure 6A:
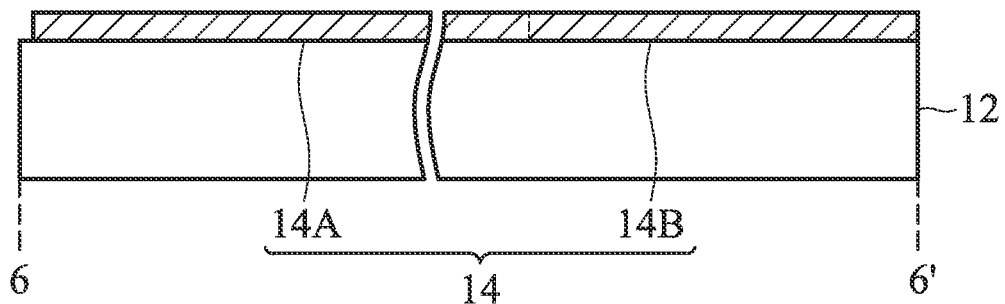
FIGS. 6A to 6F are schematic cross-sectional views illustrating the method for fabricating the display device as shown in FIG. 5 taken along the line 6-6'.
Figure 6B:
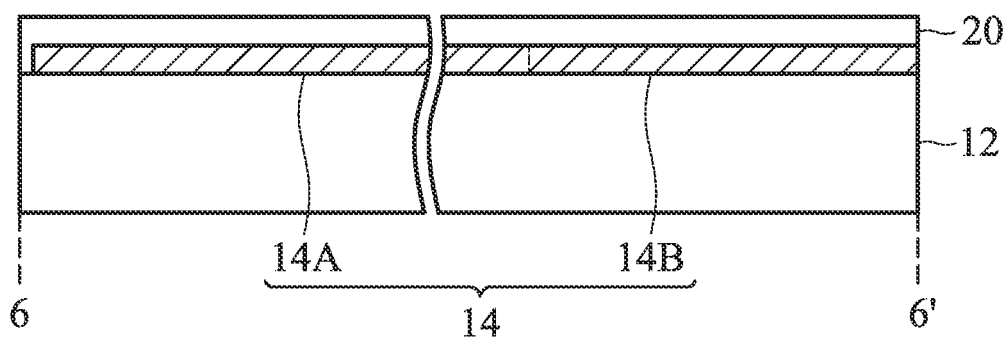
Figure 6C:
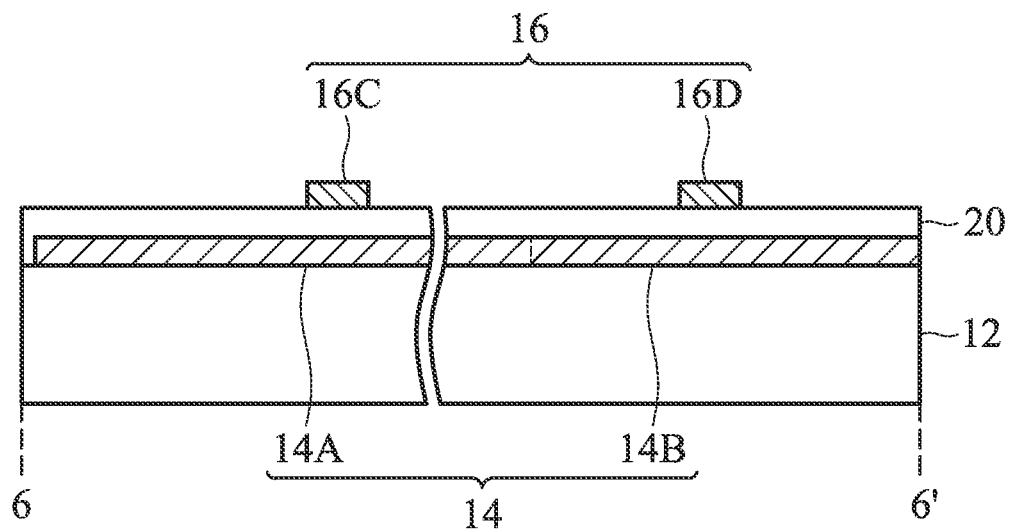

Next, as shown in FIG. 6B, a first insulation layer 20 is formed on the first substrate 12 to cover the active layer 14. The first insulation layer 20 can be organic insulating material (such as photosensitive resin) or inorganic insulating material (such as silicon nitride, silicon oxide, silicon oxynitride, silicon carbide, alumina, or a combination thereof). Next, as shown in FIG. 6C, a first electrode layer 16 is formed on the first insulation layer 20, wherein the first electrode layer 16 can extend along the first direction X serving as a gate electrode line. The first electrode layer 16 can include a first gate electrode portion 16C and a second gate electrode portion 16D.

The region of the first electrode layer 16, which overlaps the first active layer portion 14A, is defined as the first gate electrode portion 16C. Namely, a projection of the first active layer portion 14A onto the first substrate 12 overlaps the whole projection of the first gate electrode portion 16C onto the first substrate 12. In addition, the region of the first electrode layer 16, which does not overlap the first active layer portion 14A, is defined as the second gate electrode portion 16D. Namely, a projection of the first active layer portion 14A onto the first substrate 12 is proximate to a projection of the second gate electrode portion 16D onto the first substrate 12 (i.e. the projection of the first active layer portion 14A onto the first substrate 12 does not overlap a projection of the second gate electrode portion 16D onto the first substrate 12. Suitable materials for the first electrode layer 16 can be aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof.

Figure 6D:
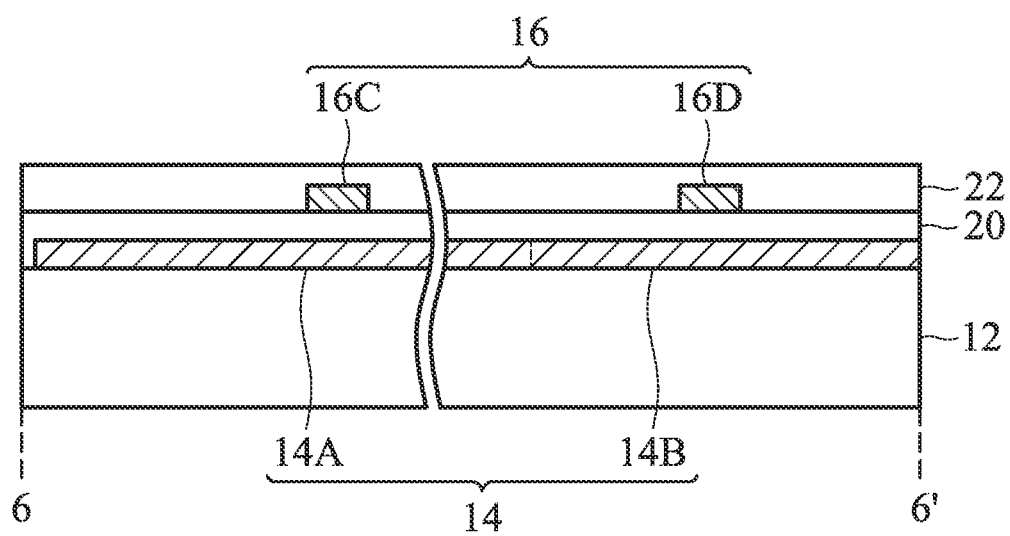
Figure 6E:
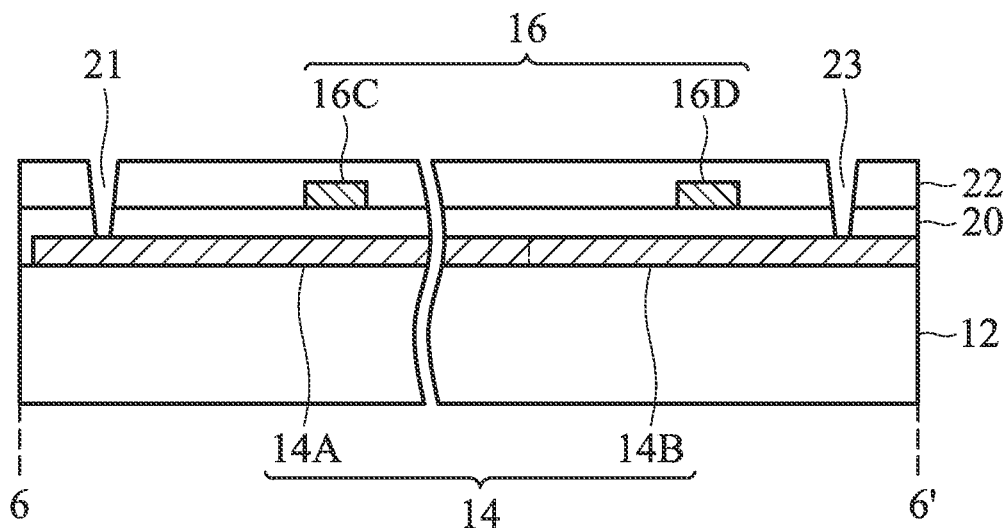

Next, as shown in FIG. 6D, a second insulation layer 22 is formed on the first insulation layer 20 to cover the first electrode layer 16. The second insulation layer 22 can be organic insulating material (such as photosensitive resin) or inorganic insulating material (such as silicon nitride, silicon oxide, silicon oxynitride, silicon carbide, alumina, or a combination thereof), and the material of the second insulation layer 22 can be different from or the same as the first insulation layer 20. Next, as shown in FIG. 6E, a contact via 21 and a contact via 23 are formed to pass through the first insulation layer 20 and the second insulation layer 22, exposing the top surface of the first active layer portion 14A and the top surface of the second active layer portion 14B respectively.

Figure 6F:
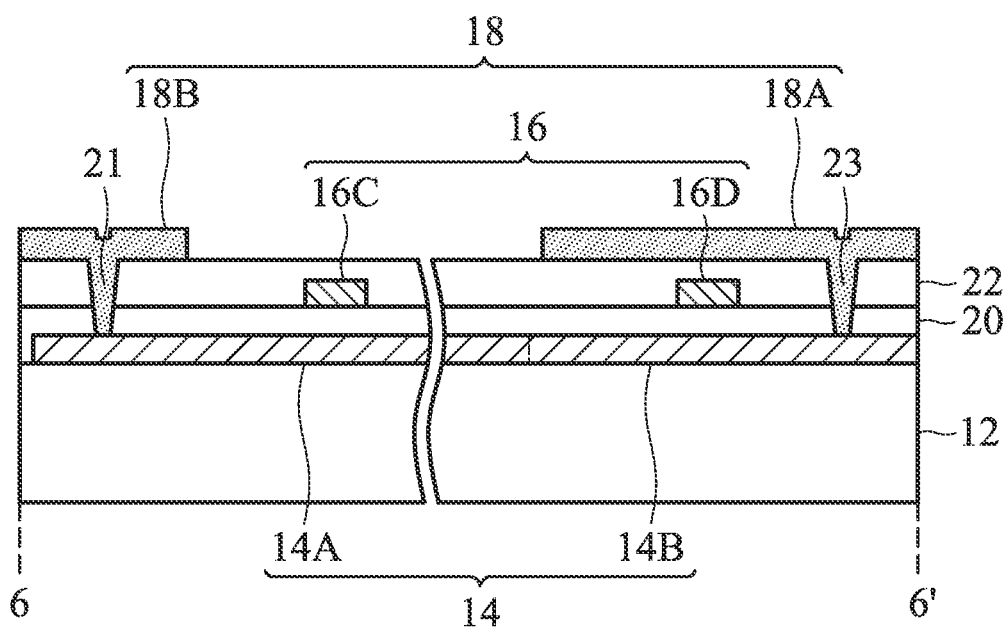

Finally, a second electrode layer 18 is formed on the second insulation layer 22, as shown in FIG. 6F and FIG. 5. The second electrode layer 18 includes a data line 18A extending along the second direction Y and a conductive pattern 18B, wherein the data line 18A is in electrical contact with the conductive pattern 18B, but the data line 18A is not in direct contact with the conductive pattern 18B. In addition, the data line 18A is in electrical contact with the second active layer portion 14B via the contact via 23 passing through the first insulation layer 20 and the second insulation layer 22. The conductive pattern 18B is in electrical contact with the first active layer portion 14A via the contact via 21 passing through the first insulation layer 20 and the second insulation layer 22. According to some embodiments of the disclosure, the display device 10 may additionally include a light shielding layer (not shown) disposed on the first substrate 12 and under the active layer 14. The light shielding layer can be a black matrix, wherein the material of the black matrix can be organic insulating material (such as photosensitive layer) or metal-containing material. The active layer 14 can be separated from the light shielding layer by an insulation layer (not shown). According to other embodiments of the disclosure, a projection of the light shielding layer onto the first substrate 12 can partially overlaps a projection of the conductive pattern 18B onto the first substrate 12. Further, according to another embodiment of the disclosure, the projection of the light shielding layer onto the first substrate 12 does not overlap the projection of the conductive pattern 18B onto the first substrate 12.

Figure 7:
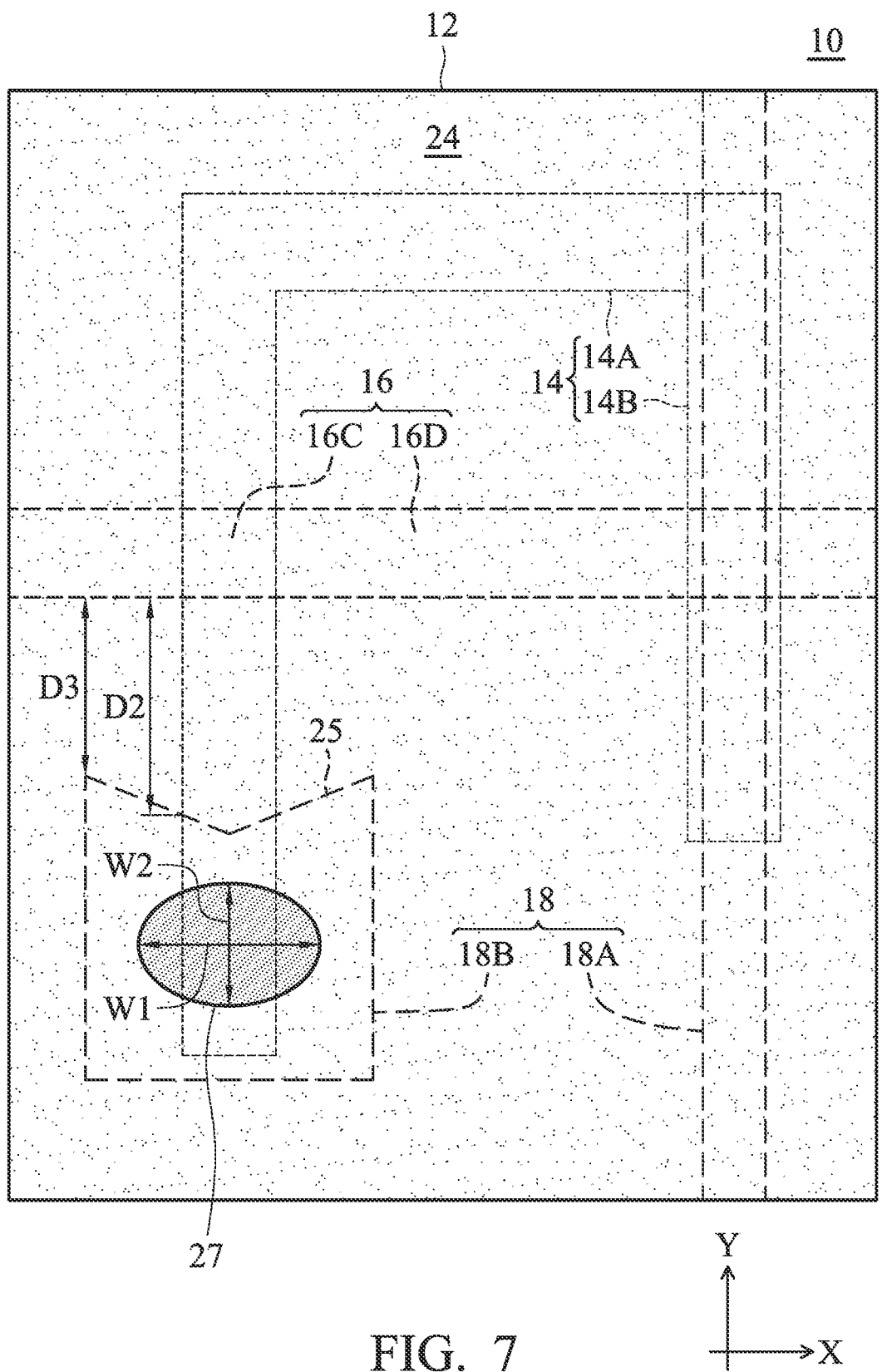
FIGS. 7-8 are schematic top views of the display device according to embodiments of the disclosure.

According to the embodiments of the disclosure, the display device 10 can further include a third insulation layer 24 disposed on the second insulation layer (not shown) to cover the second electrode layer 18, as shown in FIG. 7. A contact via 27 passes through the third insulation layer 24 to expose the conductive pattern 18B to facilitate the electrical connection between a subsequently formed pixel electrode layer (not shown) and the conductive pattern 18B. A projection of the contact via 27 onto the first substrate 12 has a maximum width W1 in the first direction X, and the projection of the contact via 27 onto the first substrate 12 has a maximum width W2 in the second direction Y. It should be noted that the maximum width W1 is not equal to the maximum width W2. For example, the maximum width W1 of the projection of the contact via 27 onto the first substrate 12 in the first direction X can be greater than the maximum width W2 of the projection of the contact via 27 onto the first substrate 12 in the second direction Y, as shown in FIG. 7. As a result, due to the designed shape of the aforementioned contact via 27, the width of the black matrix shielding the gate electrode line 16 and the contact via 27 in the second direction Y can be reduced in order to increase the aperture ratio. Herein, the maximum width W1 can be between 3.0 µm and 15.0 µm, the maximum width W2 can be between 2.0 µm and 13.0 µm, and the ratio of the maximum width W2 to the maximum width W1 (W2/W1) can be between about 0.5 and 0.8, preferably between about 0.65 and 0.75.

Figure 8:
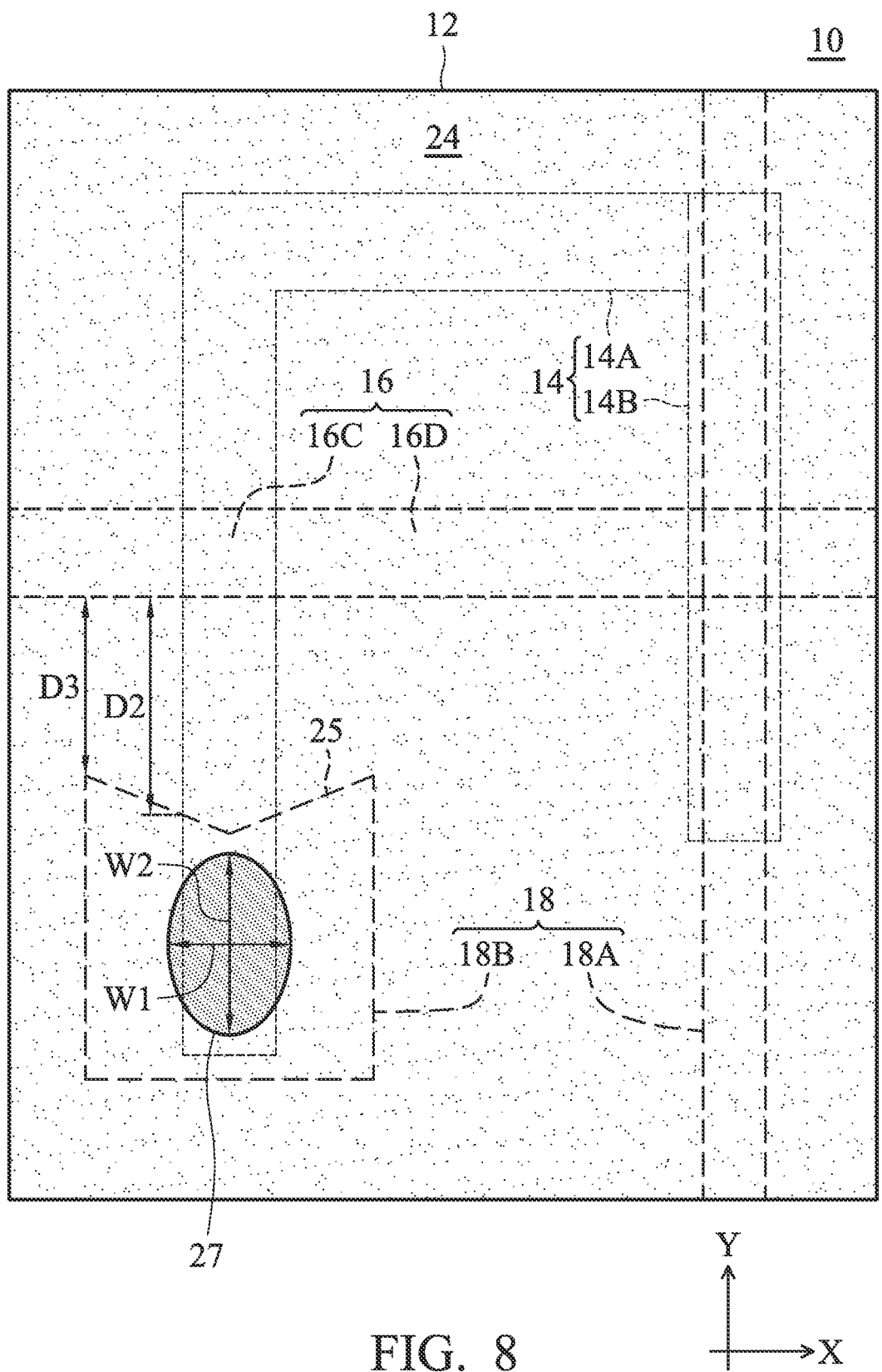

On the other hand, according to other embodiments of the disclosure, the maximum width W1 of the projection of the contact via 27 onto the first substrate 12 in the first direction X can be less than the maximum width W2 of the projection of the contact via 27 onto the first substrate 12, as shown in FIG. 8. As a result, due to the designed shape of the aforementioned contact via 27, the pixel pitch of the display device can be reduced and the pixel resolution of the display device can be increased on the premise that the contact area between the pixel electrode and the conductive pattern 18B is sufficient. Herein, the maximum width W1 can be between 2.0 µm and 13.0 µm, the maximum width W2 can be between 3.0 µm and 15.0 µm, and the ratio of the maximum width W1 to the maximum width W2 (W1/W2) can be between about 0.5 and 0.8, preferably between about 0.65 and 0.75.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device comprising:
  a substrate;
  an active layer disposed above the substrate;
  a gate electrode line disposed above the substrate; and
  a second electrode layer disposed above the substrate and comprising:
    a data line crossing the gate electrode line; and
    a conductive pattern that is in electrical contact with the active layer, wherein the conductive pattern includes a first side extending in a first direction, a second side extending in the first direction, and a third side connected between the first side and the second side, and wherein the third side is adjacent to the gate electrode line and includes a part not parallel to the first direction and not perpendicular to the first direction,
  wherein the active layer has a U shape when viewed in a top view, the active layer comprises a first portion extending in the first direction, a second portion extending in the first direction, and a third portion connecting the first portion to the second portion, and
  wherein the first portion and the second portion are different in length.

2. The display device according to claim 1, wherein the third side includes a depression.

3. The display device according to claim 2, wherein the depression is depressed in a direction away from the gate electrode line.

4. The display device according to claim 1, wherein the gate electrode line has a part overlapping the active layer, and
  wherein a projection of the part of the gate electrode line onto the substrate and a projection of the conductive pattern onto the substrate are passed by a line parallel to the first direction.

5. The display device according to claim 1,
  wherein the conductive pattern includes a first conductive portion and a second conductive portion, the first conductive portion connects to the second conductive portion, and the first conductive portion is disposed between the second conductive portion and the gate electrode line, and
  wherein the first conductive portion has a first maximum width along a direction orthogonal to the first direction, and the second conductive portion has a second maximum width along a direction orthogonal to the first direction, and the first maximum width is less than the second maximum width.

6. The display device according to claim 1, wherein the data line and the conductive pattern are in electrical contact with the active layer through a first contact via and a second contact via, respectively.

7. The display device according to claim 1, further comprising:
   a first insulation layer disposed above the active layer, wherein the gate electrode line is disposed above the first insulation layer; and
   a second insulation layer disposed above the gate electrode line, wherein the second electrode layer is disposed above the second insulation layer.

8. The display device according to claim 1, wherein the data line extends in the first direction.

* * * * *